United States Patent [19]

Chandra

[11] Patent Number: 4,818,943
[45] Date of Patent: Apr. 4, 1989

[54] PHANTOM FOR IMAGING SYSTEMS

[75] Inventor: Ramesh Chandra, Ardsley, N.Y.

[73] Assignee: New York University, New York, N.Y.

[21] Appl. No.: 938,318

[22] Filed: Dec. 5, 1986

[51] Int. Cl.⁴ ............................................. G01R 33/20
[52] U.S. Cl. .................................... 324/318; 324/307; 378/207
[58] Field of Search ............... 324/300, 307, 308, 309, 324/312, 318, 319, 320; 378/207; 336/231; 250/252.1, 252.1 R

[56] References Cited

U.S. PATENT DOCUMENTS

| | | | |
|---|---|---|---|
| 4,014,109 | 3/1977 | Schramm | 250/510 |
| 4,070,617 | 1/1978 | Kachel et al. | 324/71.1 |
| 4,280,047 | 7/1981 | Enos | 250/252 |
| 4,352,020 | 9/1982 | Horiba et al. | 250/252.1 |
| 4,385,277 | 5/1983 | Hanley | 324/319 |
| 4,499,375 | 2/1985 | Jaszczak | 250/252.1 |
| 4,551,678 | 11/1985 | Morgan et al. | 324/300 |
| 4,585,992 | 4/1986 | Maudsley et al. | 324/309 |
| 4,613,819 | 9/1986 | Chui | 324/318 |
| 4,618,826 | 10/1986 | Smith et al. | 324/308 |
| 4,625,168 | 11/1986 | Meyer et al. | 324/318 |

OTHER PUBLICATIONS

"MRI . . . An Introduction to Basic Principles", Phillips Medical Systems, Inc., brochure.
"VISTA MR Magnetic Resonance Imaging Systems", Picker, brochure.
"STC Phantom", Nuclear Associates, brochure.
Charles W. Coffey et al., "A New Slice Geometry Phantom for Tomographic Imagers", Medical Physics, vol. 13, No. 4, AAPM Annual Meeting Issue, Lexington, Kentucky, p. 583 (Jul.-Aug. 1986).
"MRI Multi-Purpose Phantom", Nuclear Associates, brochure.
"Gyroscan MRI Program", Phillips Medical Systems, Inc., brochure.

*Primary Examiner*—Stewart J. Levy
*Assistant Examiner*—Kevin D. O'Shea
*Attorney, Agent, or Firm*—Pennie & Edmonds

[57] ABSTRACT

A phantom for evaluating and calibrating a nuclear magnetic resonance imaging system. The phantom includes a cylindrical housing having a central axis and defining a hollow region therein. The phantom also includes a first conical wall member and a second conical wall member which are congruous to each other and secured to one another at their respective bases. The conical wall members are disposed within and separate the hollow region into a first region outside of the conical wall members and a second region within the conical wall members. The first region is filled with a first predetermined fluid and the second region is filled with a second predetermined fluid. Preferably each conical wall member is symmetrical about central axis and has its apex disposed along the central axis.

26 Claims, 4 Drawing Sheets

PHANTOM FOR IMAGING SYSTEMS

TECHNICAL FIELD

The present invention relates to a phantom for evaluating tomographic imaging devices. In particular, the present invention relates to a phantom for evaluating and calibrating a nuclear magnetic resonance (NMR) imaging system.

BACKGROUND ART

Nuclear magnetic resonance (NMR) imaging is a technique for creating pictures of body structures or organs without the need of exploratory surgery. However, unlike X-ray examination, NMR does not use any ionizing radiation. In addition NMR procedures do not require the injection of radiactive substances which otherwise are utilized to provide for measurements of the substances after their introduction into the body. Instead, a large magnet, a radio transmitter/receiver and a computer are used to obtain information from certain atoms in the human tissue. This information in turn is then utilized to create images of pictures of the internal anatomy of the body.

In particular, NMR systems can electronically produce multislice images of a given volume in standard orthozonal sections or at any angle with respect to standard body axes. Well-known NMR devices today include, for example, the GYROSCAN which is manufactured by the Philips Medical Systems, Inc., 710 Bridgeport Avenue, Shelton, Conn. 06484. For further discussion of the operation of an NMR device, reference is made to U.S. Pat. No. 4,585,992 entitled NMR IMAGING METHODS and which was assigned to the Philips Medical Systems, Inc., Shelton, Conn. Accordingly, this patent is incorporated herein in its entirety. Another NMR resonance imaging system is the VISTA MR TM system which is manufactured by Picker International Inc., 595 Miner Road, Highland Heights, Ohio 44143.

There is almost no limit as to what portion of the human body can be imaged with an NMR imaging system such as either of the two mentioned above. Since the utilization of NMR devices is well-known in the field, further discussion of the operation of such devices is deemed unnecessary.

However in the course of utilizing NMR imaging systems, it is necessary occasionally to evaluate or otherwise calibrate the measurements typically obtained with an NMR device. Such calibration and evaluation is obtained by the use of what are termed phantoms which are structural bodies that are positioned in place of the patient within the NMR device and provide ready reference for geometrical calibration of structures already established in the phantom itself. Such phantoms provide for the determination of the accuracy and reproducibility of thickness, thickness uniformity and distance.

Phantoms for NMR illustrated and described, for example, in U.S. Pat. Nos. 4,280,047; 4,499,375; and 4,551,679. According to the latter patent, a phantom for an NMR machine is described as including a plurality of containers each of which is filled with a material having a known spin density (T1) or T2 characteristic that differs a preselected amount from the spin density (T1) or T2 characteristics of the material in at least another portion of the other containers. As illustrated in the U.S. Pat. No. 4,557,679, the phantom is employed in an NMR machine which is designed for use in medical diagnosis by measuring the spin density T1 and T2 of the human body along selected planes of slices through the body itself. The phantom which is provided to test the operation of characteristics of the NMR machine includes a plurality of containers of non-magnetic material such as glass and each of which contains a material having a known spin density T1 or T2 characteristic that differs a preselected amount from the spin density T1 or T2 characteristic of the material in the other containers. In the embodiment illustrated, three different phantoms of rods A, B, C are shown as being identical but for their different orientations and locations within a base member.

According to U.S. Pat. No. 4,499,375, a nuclear imaging phantom is disclosed which includes a closed case 12 containing a plurality of straight, parallel columns in the form of a plurality of sets of rods. The rods also can include a plurality of spheres which are mounted on the end of their respective posts.

According to U.S. Pat. No. 4,280,047, a phantom for radiology is described as being formed of a rectangular sealed container filled with liquid to simulate clinical scattering. In particular, the container includes a series of fixed parallel steps that present individual planar surfaces progressively spaced from the top and bottom walls. A plurality of identical groupings of discrete geometrical attentuation objects are arranged along the respective planar surfaces of steps 12.

Other commercially available phantoms include the STC (slice, thickness and contiguity) phantom provided by Nuclear Associates, 100 Voice Road, Carle Place, N.Y. This phantom consists of a cylinder filled with a solution of copper sulfate in water. It also contains a series of 90 disks of 2 mm. thickness. Each disk has a vane or vanes oriented in various positions so that each vane filled with the copper sulfate solution, results in an image. Nuclear Associates also produces a phantom which is termed the MRI multi-purpose phantom that includes a folded steep ramp section, a star pattern section, a pin pattern section, a hole pattern section, a flood section and a concentric conic section.

Yet another phantom is that provided by Charles W. Coffey, II, Ph.D of the University of Kentucky Medical Center. Dr. Coffey's phantom which is described in Medical Physics, July–August 1986 of Volume 13, No. 4 of the AAPM Annual Meeting Issue, Lexington, Ky., is a three-dimensional conic section of NMR image-producing material. More specifically, Dr. Coffey's phantom consists of a hollow conical region into which is inserted a conical member thereby leaving a relatively thin annular region common between the base member and the conic member itself.

Although the phantoms described above have offered the ability to calibrate and evaluate the various NMR devices, the difficulty with these phantoms is that signal uniformity measurement is relatively difficult and the signal to noise ratio is relatively low. In addition geometric distortions are not easily recognizable with the various configurations discussed above.

I have invented a phantom which overcomes the aforementioned limitations and problems with the phantoms of the prior art and particularly provides a relatively large signal to noise ratio which permits improved detection of geometrical distortions, angularities and slice to slice interference.

SUMMARY OF THE INVENTION

The present invention is directed to a phantom for evaluating a tomographic imaging system, comprising a housing having a central axis and defining a region therein; and a wall member disposed within the housing and separating the hollow region into a first region outside of the wall member and a second region within the wall member, the wall member having an outer surface being non-aligned with the central axis.

Preferably the wall member is conical and is symmetrical about the central axis. In addition, the conical wall member has an apex disposed along the central axis. Also the length of the conical wall member is about the length of the housing. In one preferred embodiment, the first region is filled with a first predetermined fluid and the second region is filled with a second predetermined fluid.

In an alternative preferred embodiment according to the present invention, a phantom for evaluating and calibrating a radiological imaging system such as an NMR system, comprises a housing having a central axis and defining a region therein; and at least a first conical wall member being disposed within and separating the hollow region into a first region outside of the conical wall member and a second region within the conical wall member. The phantom further comprises a second conical wall member secured to the first conical wall member at their respective bases so as to form the second region within the conical wall members. Preferably each of the conical wall members is symmetrical about the central axis and has its apex disposed along the central axis. Also, the conical wall members are congruous to each other. The distance between the respective apexes of the conical wall members is approximately about the length of the housing which has a diameter about equal to its length. In a preferred embodiment, each conical wall member has a uniform wall thickness. Alternatively at least one of the conical wall members has a non-uniform wall thickness. The housing and the conical wall members can each be formed of plastic. Preferably, the housing is cylindrical.

BRIEF DESCRIPTION OF THE DRAWINGS

The present invention is described in detail below with reference to the drawings in which.

DESCRIPTION OF THE PREFERRED EMBODIMENTS

In the description which follows, any reference to either direction or orientation is intended primarily and solely for purposes of illustration and is not intended in any way as a limitation of the scope of the present invention. Also, the particular embodiments described herein, although being preferred, are not to be considered as limiting of the present invention. Furthermore, like parts or elements in the various drawings hereto are identified by like numerals for ease of reference.

Figure 1:
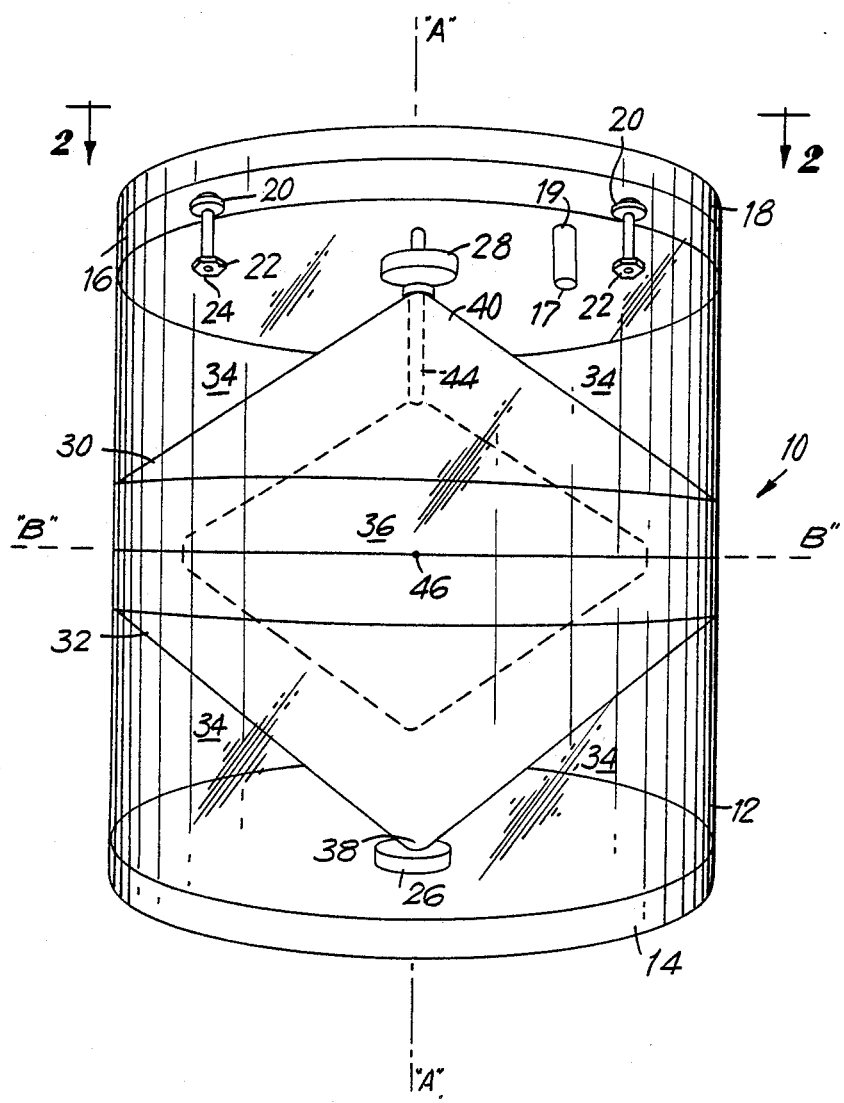
FIG. 1 is an elevational perspective view of a phantom for evaluating and calibrating a nuclear magnetic resonance (NMR) imaging system according to the present invention.
Figure 2:
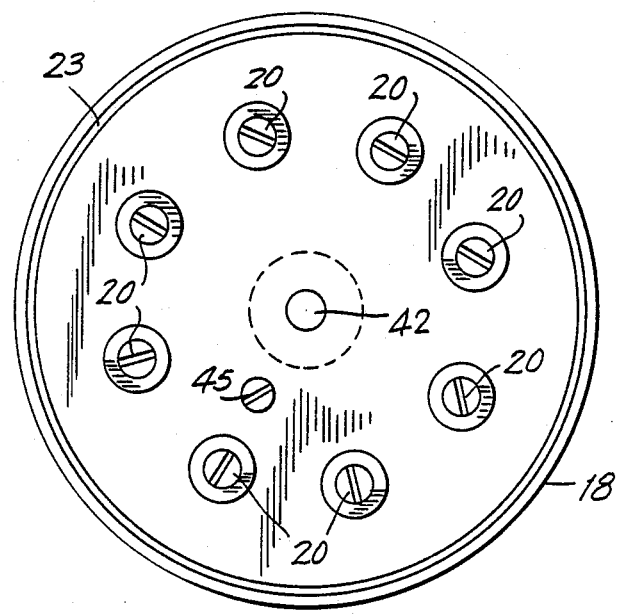
FIG. 2 is an end view of phantom according to the present invention taken along the line 2—2 of FIG. 1.

Referring to FIG. 1, a phantom 10 according to the present invention is illustrated and includes an outer housing 12 which preferably is cylindrical in configuration and has a central axis indicated at "A." The housing 12 has end caps 14 and 16. The end cap 14 is solid while the upper end cap 16 has a passageway or channel 17. The end cap 16 has secured thereto a solid outer cap 18 which is compatible in configuration with end cap 16 and is secured thereto by means of a series of bolts 20 and nuts 22 as shown in FIG. 1. The outer cap 18 has a channel or passageway 19 which is aligned with channel 17 when outer cap 18 is positioned atop end cap 16. In particular, the nuts 22 are captured in countersunk grooves 24 in the annular region of end cap 16. The bolts 20 can then be passed through respective passageways or channels in upper cap 18 and end cap 16 and threaded into the nuts 22. The bolts 20 can be arranged in any preferred pattern and preferably are positioned in a circular arrangement as illustrated in FIG. 2. In order to assure a proper fluid seal between caps 16 and 18, an O-ring 23 as shown in FIG. 2 is provided therebetween. The end caps 14 and 16 each have a retaining collar 26 and 28, respectively, whose functions will be described in more detail hereinbelow.

Positioned within the cylindrical housing 12 are two hollow symmetrical cones 30 and 32 which are congruous to each other and are inverted so that they are secured to each other at the respective bases as shown in FIG. 1. The wall members of cones 30 and 32 are preferably uniform although they can be non-uniform if desired. The cones 30 and 32 are hollow so that the wall members thereof separate the hollow region of cylindrical housing 12 into a first region 34 outside of the cones and a second region 36 which is hollow and within the cones 30, 32. Preferably the first region 34 is filled with a first predetermined fluid that provides a suitable signal during the NMR processing. First region 34 can be filled by pouring in the desired fluid through the channels 18 and 19 of caps 16 and 18, respectively. Likewise a second fluid fills the second region 36 and also provides a suitable signal during NMR processing. Preferably, these fluids can be the same and are formed of saline solutions containing a relatively small amount of paramagnetic ions. Alternatively, these fluids can be propanol or glycol solutions.

The cones 30, 32 are symmetrical about the central axis of the housing 12 and have their respective apexes 38 and 40 mounted and secured within the retaining collars 26 and 28, respectively. In order to permit filling of the inner region 36 within the cones 30, 32, a passageway or channel 42 as shown in FIG. 2 is provided through the end cap 16 and upper cap 18. In turn, passageway 42 is in fluid communication with a passageway or channel 44 which passes through the apex of cone 30. In this manner, fluid can be entered through passageway 42, 44 into the inner region 36. After filling, the channels 42 and 19 can be plugged by suitable means such as screw 45 shown embedded in channel 19 in FIG. 2.

Figure 3:
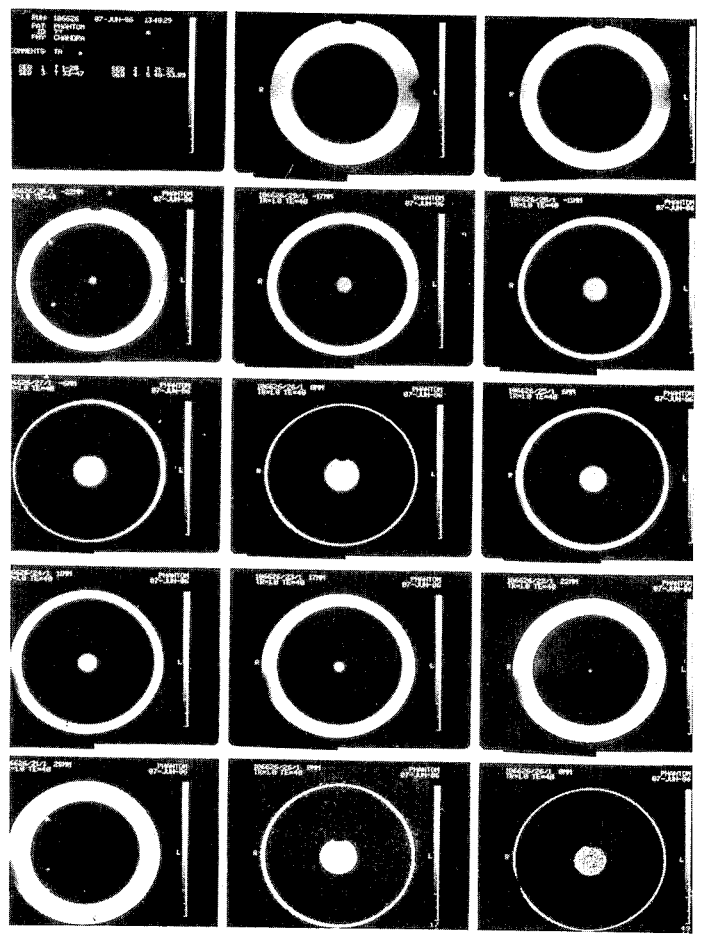
FIG. 3 is a photographic layout of NMR slices taken at different offsets from the isocenter of a phantom according to the present invention.
Figure 4:
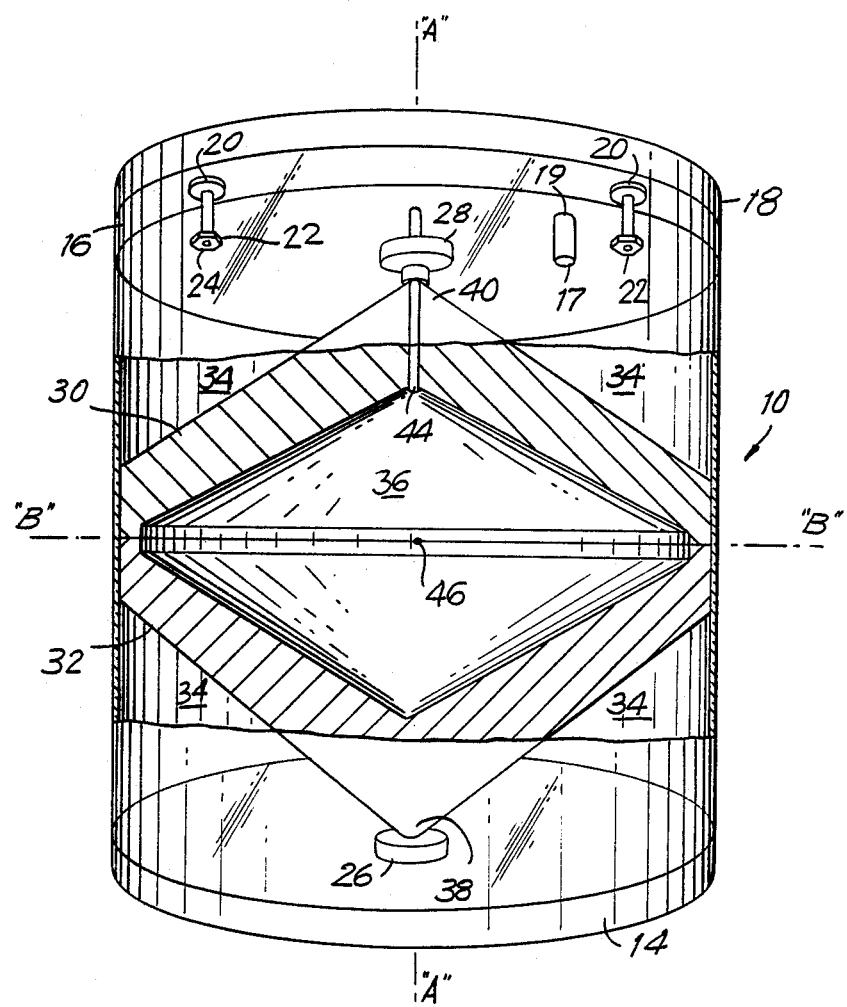
FIG. 4 is an elevational cross-sectional view of an alternative preferred embodiment of the phantom of FIG. 1.

Referring to FIG. 3, a series of NMR slices or images taken at different respective positions offset from the geometric center 46 of the phantom 10 are illustrated. Typically the geometric center of the phantom 10 will be positioned to correspond to the isocenter of the NMR machine. Notably as the slices approach the isocenter, the central image or light spot increases in size in relation to the increasing diameter of the inner region 36. In reverse, as the slice is taken farther from the isocenter 46, the outer light ring increases in size while the inner light ring decreases accordingly. An alternative embodiment of the phantom 10 of the present invention is illustrated in FIG. 4 wherein the wall members of the cones 30 and 32 are of a non-uniform thickness and in particular are thicker at the apexes than at the outer regions of the cones 30 and 32.

Preferably the cones 30 and 32 are formed of wall members that are sloped at 45° from line B which is shown in FIG. 1 passing through the geometrical center 46. In the alternative embodiment shown in FIG. 4, the inner surface of the wall members of cones 30 and 32 are sloped at a smaller angle than the outer surface of the same wall members. One preferred embodiment has an inner surface sloped at 22.5° from line B. In addition, the retaining collars 26 and 28 as well as the apexes 38 and 40 are preferably positioned along the central axis "A." However, either of both sets of corresponding collars and apexes 26, 38 and 28, 40 can be positioned offset at any desired distance from the central axis "A." Moreover, although the phantom of the present invention has been illustrated as a pair of congruous inverted conical wall members 30, 32 joined together at their respective bases, either of cones 30 and 32 can be employed independently of the other. In that case, the cone used can be enlarged so that it extends the entire length of housing 12. Also, the housing 12 and wall members 30 and 32 can be of other desired shapes without departing from the scope of the present invention.

According to the preferred embodiment, the phantom 10 can be formed of plastic or glass or other non-metallic suitable material for containing the fluids that will provide suitable signals for NMR processing. In assembly, the different components can be machined and glued together or ultrasonically welded according to well-known methods. Preferably, for a phantom 10 to be employed with a head coil in an NMR device, the preferred embodiment is formed of a cylindrical housing having a length of 8" and also a diameter of 8". Therefore, the distance between the apexes 38, 40 of the cones 30, 32 will also be about 8". For larger body coils, of course, larger phantoms can be employed.

Although the phantom 10 according to the present invention has been described for use in an NMR device, the phantom 10 can also be used in other tomographic devices as well. In the case of X-ray examination equipment, the wall members of cones 30, 32 will provide the imaging surfaces for evaluation and calibration purposes.

With the phantom 10 according to the present invention, it is possible to obtain in only one set of multislice scans measurements of a number of parameters to evaluate the quality of and to permit calibration of the NMR device. These numerous parameters include slice thickness, slice offset (from the isocenter), uniformity of slice thickness, slice angle, slice gap (if any), signal uniformity, signal to noise ratio, geometrical distortions, angularities and slice to slice interferences. With other phantoms, it would be necessary to perform numerous sets of scans or else different numerous groups of phantoms would be required in order to evaluate the various parameters noted above. In addition, the relatively large signal to noise ratio available due to the relatively large volume of fluid region 34 and 36 greatly improves the aforementioned evaluations.

While the present invention has been described and illustrated herein with respect to preferred embodiments thereof, it should be apparent that various modifications, adaptations and variations may be made utilizing the teachings of the present disclosure without departing from the scope of the invention, and are intended to be within the scope of the present invention.

What I claim is:

1. A phantom comprising:
    a. housing having a central axis and defining a hollow region therein; and
    b. wall member disposed within said housing and separating said hollow region into a first region outside of said wall member and a second region within said wall member, said wall member having an outer surface being non-aligned with said central axis, said first and said second regions being separately filled with a predetermined fluid so as to permit evaluation of a tomographic imaging system.

2. The phantom according to claim 1 wherein said wall member is conical.

3. The phantom according to claim 2 wherein said conical wall member is symmetrical about said central axis and has an apex disposed along said central axis.

4. The phantom according to claim 3 wherein the length of said conical wall member along said central axis is about the length of said housing.

5. The phantom according to claim 1 wherein said first region is filled with a first predetermined fluid.

6. The phantom according to claim 5 wherein said second region is filled with a second predetermined fluid.

7. A phantom comprising:
    a. housing having a central axis and defining a hollow region therein; and
    b. at least a first conical wall member being disposed within and separating said hollow region into a first region outside of said conical wall member and a second region within said conical wall member, said first and said second regions being separately filled with a predetermined fluid for evaluating and calibrating a radiological imaging system.

8. A phantom comprising:
    a. housing having a central axis and defining a hollow region therein; and
    b. at least a first conical wall member being disposed within and separating said hollow region into a first region outside of said conical wall member and a second region within said conical wall member, further comprising a second conical wall member secured to said first conical wall member at their respective bases so as to form said second region within said conical wall members for evaluating and calibrating a radiological imaging system.

9. The phantom according to claim 8 wherein each of said conical wall members is symmetrical about said central axis and has its apex disposed along said central axis.

10. The phantom according to claim 9 wherein said conical wall members are congruous to each other.

11. The phantom according to claim 10 wherein the distance between the respective apexes of said conical wall members is approximately about the length of said housing.

12. The phantom according to claim 11 wherein said housing has a diameter about equal to the length of said housing.

13. The phantom according to claim 8 wherein each said conical wall member has a uniform wall thickness.

14. The phantom according to claim 8 wherein at least one of said conical wall members has a non-uniform wall thickness.

15. The phantom according to claim 8 wherein said housing and said conical wall members are each formed of plastic.

16. The phantom according to claim 8 wherein said first region is filled with a first predetermined fluid.

17. The phantom according to claim 16 wherein said second region is filled with a second predetermined fluid.

18. A phantom for evaluating and calibrating a nuclear magnetic resonance imaging system, comprising:
   a. cylindrical housing having a central axis and defining a hollow region therein; and
   b. a first conical wall member and a second conical wall member being congruous to each other and secured to one another at their respective bases, said conical wall members being disposed within and separating said hollow region into a first region outside of said conical wall members and a second region within said conical wall members, said first region being filled with a first predetermined fluid and said second region being filled with a second predetermined fluid, each said conical wall member having a generally linear surface in a direction from said respective base toward said respective apex, such that measurements can be made of parameters at least including slice thickness, slice offset from the isocenter, uniformity of slice thickness, slice angle, slice gap if any, signal uniformity, signal to noise ratio, geometrical distortions, angularities and slice to slice interferences.

19. The phantom according to claim 18 wherein each of said conical wall members is symmetrical about said central axis and has its apex disposed along said central axis.

20. The phantom according to claim 18 wherein said housing and said conical wall members are each formed of plastic.

21. A phantom for evaluating and calibrating a nuclear magnetic resonance imaging system, comprising:
   a. cylindrical housing having a central axis and defining a hollow region therein; and
   b. a first conical wall member and a second conical wall member being congruous to each other and secured to one another at their respective bases, said conical wall members being disposed within and separating said hollow region into a first region outside of said conical wall members and a second region within said conical wall members, said first region being filled with a first predetermined fluid and said second region being filled with a second predetermined fluid, wherein each of said conical wall members is symmetrical about said central axis and has its apex disposed along said central axis, and wherein the distance between the respective apexes of said conical wall members is approximately about the length of said cylindrical housing.

22. The phantom according to claim 21 wherein said cylindrical housing has a diameter about equal to the length of said cylindrical housing.

23. A phantom for evaluating and calibrating a nuclear magnetic resonance imaging system, comprising:
   a. cylindrical housing having a central axis and defining a hollow region therein; and
   b. a first conical wall member and a second conical wall member being congruous to each other and secured to one another at their respective bases, said conical wall members being disposed within and separating said hollow region into a first region outside of said conical wall members and a second region within said conical wall members, said first region being filled with a first predetermined fluid and said second region being filled with a second predetermined fluid, wherein each said conical wall member has a uniform wall thickness.

24. A phantom for evaluating and calibrating a nuclear magnetic resonance imaging system, comprising:
   a. cylindrical housing having a central axis and defining a hollow region therein; and
   b. a first conical wall member and a second conical wall member being congruous to each other and secured to one another at their respective bases, said conical wall members being disposed within and separating said hollow region into a first region outside of said conical wall members and a second region within said conical wall members, said first region being filled with a first predetermined fluid and said second region being filled with a second predetermined fluid, wherein at least one of said conical wall members has a non-uniform wall thickness.

25. A phantom for evaluating and calibrating a nuclear magnetic resonance imaging system, comprising:
   a. cylindrical housing having a central axis and defining a hollow region therein; and
   b. a first conical wall member and a second conical wall member being congruous to each other and secured to one another at their respective bases, said conical wall members being disposed within and separating said hollow region into a first region outside of said conical wall members and a second region within said conical wall members, said first region being filled with a first predetermined fluid and said second region being filled with a second predetermined fluid, wherein said housing has a first passageway and at least one of said conical wall members has a second passageway communicating at one end with said first passageway and at its other end with said second region so that said second region can be filled with said second predetermined fluid through said first passageway and said second passageway.

26. The phantom according to claim 25 wherein said second passageway is disposed at the apex of said at least one conical wall member.

* * * * *